US012687948B2

(12) United States Patent
Azumi et al.

(10) Patent No.: US 12,687,948 B2
(45) Date of Patent: Jul. 21, 2026

(54) TECHNIQUES FOR REDUCING BASELINE CAPACITANCE IN A MUTUAL CAPACITANCE TOUCH SENSOR PANEL

(71) Applicant: Apple Inc., Cupertino, CA (US)

(72) Inventors: Kohei Azumi, Los Gatos, CA (US);
Sagar R. Vaze, Santa Clara, CA (US);
Saurabh Singh, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 19/067,403

(22) Filed: Feb. 28, 2025

(65) Prior Publication Data

US 2025/0278150 A1     Sep. 4, 2025

Related U.S. Application Data

(60) Provisional application No. 63/560,576, filed on Mar. 1, 2024.

(51) Int. Cl.
G06F 3/041     (2006.01)
G06F 3/044     (2006.01)
H10H 29/34     (2025.01)

(52) U.S. Cl.
CPC ........ G06F 3/04164 (2019.05); G06F 3/0443 (2019.05); *G06F 2203/04111* (2013.01); *H10H 29/34* (2025.01)

(58) Field of Classification Search
None
See application file for complete search history.

(56) References Cited

U.S. PATENT DOCUMENTS

| | | | |
|---|---|---|---|
| 11,556,216 B2 | 1/2023 | Blondin et al. | |
| 11,662,867 B1 | 5/2023 | Krah et al. | |
| 2022/0107524 A1 | 4/2022 | Zhao | |
| 2023/0118216 A1 | 4/2023 | Smith et al. | |
| 2023/0128245 A1 | 4/2023 | Huang et al. | |
| 2024/0028155 A1 | 1/2024 | Vaze et al. | |
| 2024/0103669 A1 | 3/2024 | Paul et al. | |
| 2024/0168583 A1 | 5/2024 | Kim et al. | |
| 2025/0278150 A1* | 9/2025 | Azumi .................. | G06F 3/0448 |

FOREIGN PATENT DOCUMENTS

| | | | | |
|---|---|---|---|---|
| CN | 104090698 A | 10/2014 | | |
| CN | 107422931 A | 12/2017 | | |
| CN | 112433648 A | 3/2021 | | |
| CN | 112631457 A | * 4/2021 | .......... | G06F 3/0412 |
| CN | 113282201 A | 8/2021 | | |
| CN | 115877972 A | * 3/2023 | ............. | H10K 59/40 |

* cited by examiner

*Primary Examiner* — Duane N Taylor, Jr.
(74) *Attorney, Agent, or Firm* — Kubota & Basol LLP

(57)     ABSTRACT

In some examples, a touch sensor panel includes a plurality of touch electrodes in a first layer including a plurality of first drive electrodes along a first axis, a plurality of second drive electrodes along the first axis, and a plurality of sense electrodes formed of sense electrode segments along a second axis. The touch sensor panel includes a plurality of bridges in a second layer. Optionally the plurality of bridges includes one or more portions along the second axis configured to electrically connect the sense electrode segments to form the plurality of sense electrodes, and includes one or more portions along the first axis disposed under the plurality of second drive electrodes.

20 Claims, 6 Drawing Sheets

COMPUTING
SYSTEM
200

PERIPHERALS
202  204

201  OPTICAL
DEVICE(S)

203  SPEAKER(S)

TOUCH
PROCESSOR

228  HOST
PROCESSOR

206  TOUCH
CONTROLLER

212  RAM

215  CHARGE
PUMP

PROGRAM
STORAGE  232

208  SENSE
CHANNELS

CHANNEL
SCAN LOGIC

DRIVER
LOGIC

STIMULATION
SIGNALS
216

210  214

CONTROL
SIGNALS

TOUCH    TOUCH    DRIVE
NODE     NODE     LINE
226      227      222

224
DRIVE
INTERFACE

223
SENSE LINE

220
TOUCH
SCREEN 217        225
SENSE      SENSE
SIGNALS    INTERFACE

DISPLAY
DRIVER

234

TECHNIQUES FOR REDUCING BASELINE CAPACITANCE IN A MUTUAL CAPACITANCE TOUCH SENSOR PANEL

CROSS-REFERENCE TO RELATED APPLICATIONS

This application claims the benefit of U.S. Provisional Application No. 63/560,576, filed Mar. 1, 2024, the contents of which is herein incorporated by reference in its entirety for all purposes.

FIELD OF THE DISCLOSURE

This relates generally to capacitive touch sensors and, more specifically, to techniques to reduce an effective touch baseline capacitance of a mutual capacitance touch sensor.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are popular because of their ease and versatility of operation as well as their declining price. Touch screens can include a touch sensor panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed by a matrix of transparent, semi-transparent or non-transparent conductive plates made of materials such as Indium Tin Oxide (ITO). In some examples, the conductive plates can be formed from other materials including conductive polymers, metal mesh, graphene, nanowires (e.g., silver nanowires) or nanotubes (e.g., carbon nanotubes). In some implementations, due in part to their substantial transparency, some capacitive touch sensor panels can be overlaid on a display to form a touch screen, as described above. Some touch screens can be formed by at least partially integrating touch sensing circuitry into a display pixel stackup (e.g., the stacked material layers forming the display pixels).

BRIEF SUMMARY OF THE DISCLOSURE

Examples described herein relate generally to capacitive touch sensors and, more specifically, to techniques to reduce an effective touch baseline capacitance of a mutual capacitance touch sensor. In some examples, a touch screen or touch sensor panel can include one or more touch electrodes configured for detecting an object on or near a surface. Various touch sensing techniques can be used including mutual capacitance and self-capacitance, among other options. In some examples, a differential drive technique is employed for mutual capacitance touch sensing. In the differential drive technique, two different drive signals are applied to two different drive electrodes (corresponding to a touch node). For example, a touch node optionally includes a +Tx electrode and −Tx electrode that can be driven with two drive signals (or stimulation signals). In some examples, the touch node includes two +Tx electrodes and two −Tx electrodes that can be driven with the two drive signals (or stimulation signals). The two drive signals can have the same amplitude and frequency, and different (e.g., opposite) phases. The touch node optionally also includes a receiver electrode (e.g., also referred to as an Rx electrode or a sensor electrode). In some examples, the Rx electrode(s) are formed of sense electrode segments.

When the drive electrodes of the touch node are stimulated by the differential drive signals, a first mutual capacitance forms between the +Tx electrode(s) and the Rx electrode and a second mutual capacitance forms between the −Tx electrode(s) and the Rx electrode. As described herein, one (or both) of the aforementioned mutual capacitances may change based on a capacitance between the touch node and an object (e.g., a finger or stylus touching or in proximity to the touch node), and this change is used to detect the object touching or in proximity to the touch node. However, the aforementioned mutual capacitances (e.g., the first mutual capacitance and the second mutual capacitance) result in an effective baseline mutual capacitance of the touch node, which is approximately the difference between the mutual capacitance between the +Tx electrode(s) and the Rx electrode (e.g., the first capacitance) and the mutual capacitance of the −Tx electrode(s) and the Rx electrode (e.g., the second capacitance). In some examples, the effective baseline mutual capacitance refers to the capacitance of the touch sensor when there is no touch or hover at the touch sensor. In some examples, it is desirable for the effective baseline mutual capacitance to be reduced or eliminated (e.g., such as by increasing the second mutual capacitance between the −Tx electrode(s) and the Rx electrode (e.g., by effectively increasing the second mutual capacitance, such as by introducing additional electrodes to the touch node)).

In some examples, the +Tx electrodes, −Tx electrodes, and Rx electrodes are disposed in the same layer of the touch node. A distance between the +Tx electrode(s) and the Rx electrode of the touch node is optionally less than a distance between the −Tx electrode and the Rx electrode of the touch node. In such an arrangement, because the capacitance is inversely proportional to distance, the first mutual capacitance is optionally greater than the second mutual capacitance. To increase the second mutual capacitance (e.g., to effectively increase the second mutual capacitance), some of the present examples include touch nodes including bridge portions, which optionally include the addition of electrodes, expansion of the area of certain electrodes, and/or portions that structurally expand in a different layer of the touch node. For example, some of the mutual capacitance touch sensor panels described herein have touch electrodes formed in the same first layer and use bridges in a second layer that is different from the first layer. A bridge optionally includes one or more conductive portions that electrically connect two touch electrode segments of a touch electrode, such as an Rx electrode (or sense electrode), using one or more electrical vias from the second layer to the first layer. In some examples, the bridge includes one or more conductive portions that structurally expand in the second layer (e.g., that structurally expand (e.g., extend) parallel to the −Tx electrode(s) of the touch node) and/or the bridge includes one or more portions that connect to or include additional electrodes disposed in the second layer. In some examples, the expanded portions of the bridge and/or the additional electrodes of the bridge are positioned in the second layer. In some examples, a distance between the −Tx electrode in the first layer and the expanded portions of the bridge and/or the additional electrodes of the bridge is less than the distance between the −Tx electrode and the Rx electrode in the first layer (and/or is less than the distance between the +Tx electrode in the first layer and the expanded portions of the bridge and/or the additional electrodes of the bridge). In some examples, the bridge portions effectively reduce a distance between the −Tx electrodes and the Rx electrode of the touch node (e.g., because the bridge portions optionally include portions that are electrically connected to the Rx electrode and portion that structurally expand parallel to the −Tx electrode(s) of the touch node), thus effectively increasing the second mutual capacitance. Additionally or alternatively, in some examples, the additional electrodes of the bridges in the second layer are electrically connected to the −Tx electrode(s) (e.g., using one or more electrical vias to the −Tx electrode(s) in the first layer), and the additional electrodes are routed underneath the Rx electrode(s) that are disposed in the first layer.

Additionally, because the capacitance of a parallel plate capacitor is proportional to area, increasing the area of the expanded portions of the bridge and/or the additional electrodes of the bridge can increase the mutual capacitance between the −Tx electrodes and the expanded portions of the bridge and/or the additional electrodes of the bridge. Because the expanded portions of the bridge and/or the additional electrodes of the bridge are optionally electrically connected to the Rx electrode (e.g., the sense electrode), the second mutual capacitance is increased (e.g., the second mutual capacitance is now a parallel combination of a first −Tx-receiver path in the first layer and a second −Tx-receiver path between the first layer and the second layer). This increased second mutual capacitance (e.g., due to the additional parallel plate capacitance between the −Tx electrodes and the expanded portions of the bridges and/or the additional electrodes of the bridges) reduces an effective touch baseline capacitance of the touch node (e.g., of the touch sensor).

DETAILED DESCRIPTION OF THE DISCLOSURE

Figure 1:
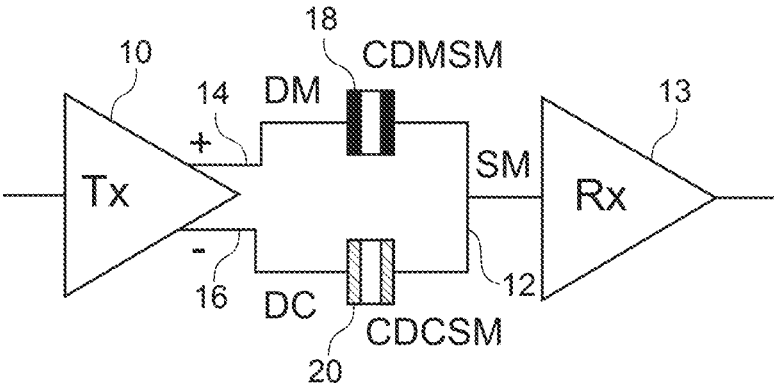
FIG. 1 illustrates a simplified diagram of a touch sensor including a differential transmitter, a receiver, two drive electrodes, an Rx electrode, and a representation of some mutual capacitances therebetween, according to some examples of the disclosure.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Described here are capacitive touch sensor panels. Generally, the touch sensor panels comprise a plurality of plates formed from a conductive material; these plates are referred to herein as "touch electrodes." The touch electrodes may be made from any suitable conductive material (e.g., a transparent conductive oxide such as ITO or aluminum zinc oxide, a metal such as copper, a metal mesh material comprising a conductive cross-hatched metal structure with gaps between cross-hatched metal lines, carbon nanotube material, or any other suitable conductive material) which may be substantially transparent or non-transparent, depending on the application. In some instances where the touch electrodes are substantially transparent, the touch sensor panel may be placed on or otherwise integrated into a display (e.g., the touch electrodes may be placed within the display stack and/or may be utilized during the operation of the display to provide display functionality) to provide a touch sensitive display. Further, in some examples, the touch sensor panels are comprised of a plurality of touch nodes, of which the touch electrodes are a part (e.g., touch electrodes are included in the plurality of touch nodes that comprise the touch sensor panels).

Examples described herein relate generally to capacitive touch sensors and, more specifically, to techniques to reduce an effective touch baseline capacitance of a mutual capacitance touch sensor. In some examples, a touch screen or touch sensor panel can include one or more touch electrodes configured for detecting an object on or near a surface. Various touch sensing techniques can be used including mutual capacitance and self-capacitance, among other options. In some examples, a differential drive technique is employed for mutual capacitance touch sensing. In the differential drive technique, two different drive signals are applied to two different drive electrodes (corresponding to a touch node). For example, a touch node optionally includes a +Tx electrode and −Tx electrode that can be driven with two drive signals (or stimulation signals). In some examples, the touch node includes two +Tx electrodes and two −Tx electrodes that can be driven with the two drive signals (or stimulation signals). The two drive signals can have the same amplitude and frequency, and different (e.g., opposite) phases. The touch node optionally also includes a receiver electrode (e.g., also referred to as an Rx electrode or a sensor electrode). In some examples, the Rx electrode(s) are formed of sense electrode segments.

When the drive electrodes of the touch node are stimulated by the differential drive signals, a first mutual capacitance forms between the +Tx electrode(s) and the Rx electrode and a second mutual capacitance forms between the −Tx electrode(s) and the Rx electrode. As described herein, one (or both) of the aforementioned mutual capacitances may change based on a capacitance between the touch node and an object (e.g., a finger or stylus touching or in proximity to the touch node), and this change is used to detect the object touching or in proximity to the touch node. However, the aforementioned mutual capacitances (e.g., the first mutual capacitance and the second mutual capacitance) result in an effective baseline mutual capacitance of the touch node, which is approximately the difference between the mutual capacitance between the +Tx electrode(s) and the Rx electrode (e.g., the first capacitance) and the mutual capacitance of the −Tx electrode(s) and the Rx electrode (e.g., the second capacitance). In some examples, the effective baseline mutual capacitance refers to the capacitance of the touch sensor when there is no touch or hover at the touch sensor. In some examples, it is desirable for the effective baseline mutual capacitance to be reduced or eliminated (e.g., such as by increasing the second mutual capacitance between the −Tx electrode(s) and the Rx electrode (e.g., by effectively increasing the second mutual capacitance, such as by introducing additional electrodes to the touch node)).

In some examples, the +Tx electrodes, −Tx electrodes, and Rx electrodes are disposed in the same layer of the touch node. A distance between the +Tx electrode(s) and the Rx electrode of the touch node is optionally less than a distance between the −Tx electrode and the Rx electrode of the touch node. In such an arrangement, because the capacitance is inversely proportional to distance, the first mutual capacitance is optionally greater than the second mutual capacitance. To increase the second mutual capacitance (e.g., to effectively increase the second mutual capacitance), some of the present examples include touch nodes including bridge portions, which optionally include the addition of electrodes, expansion of the area of certain electrodes, and/or portions that structurally expand in a different layer of the touch node. For example, some of the mutual capacitance touch sensor panels described herein have touch electrodes formed in the same first layer and use bridges in a second layer that is different from the first layer. A bridge optionally includes one or more conductive portions that electrically connect two touch electrode segments of a touch electrode, such as an Rx electrode (or sense electrode), using one or more electrical vias from the second layer to the first layer. In some examples, the bridge includes one or more conductive portions that structurally expand in the second layer (e.g., that structurally expand (e.g., extend) parallel to the −Tx electrode(s) of the touch node) and/or the bridge includes one or more portions that connect to or include additional electrodes disposed in the second layer. In some examples, the expanded portions of the bridge and/or the additional electrodes of the bridge is positioned in the second layer. In some examples, a distance between the −Tx electrode in the first layer and the expanded portions of the bridge and/or the additional electrodes of the bridge is less than the distance between the −Tx electrode and the Rx electrode in the first layer (and/or is less than the distance between the +Tx electrode in the first layer and the expanded portions of the bridge and/or the additional electrodes of the bridge). In some examples, the bridge portions effectively reduce a distance between the −Tx electrodes and the Rx electrode of the touch node (e.g., because the bridge portions optionally include portions that are electrically connected to the Rx electrode and portion that structurally expand parallel to the −Tx electrode(s) of the touch node), thus effectively increasing the second mutual capacitance. Additionally or alternatively, in some examples, the additional electrodes of the bridges in the second layer are electrically connected to the −Tx electrode(s) (e.g., using one or more electrical vias to the −Tx electrode(s) in the first layer), and the additional electrodes are routed underneath the Rx electrode(s) that are disposed in the first layer.

Additionally, because the capacitance of a parallel plate capacitor is proportional to area, increasing the area of the expanded portions of the bridge and/or the additional electrodes of the bridge can increase the mutual capacitance between the −Tx electrodes and the expanded portions of the bridge and/or the additional electrodes of the bridge. Because the expanded portions of the bridge and/or the additional electrodes of the bridge are optionally electrically connected to the Rx electrode (e.g., the sense electrode), the second mutual capacitance is increased (e.g., the second mutual capacitance is now a parallel combination of a first −Tx-receiver path in the first layer and a second −Tx-receiver path between the first layer and the second layer). This increased second mutual capacitance (e.g., due to the additional parallel plate capacitance between the −Tx electrodes and the expanded portions of the bridges and/or the additional electrodes of the bridges) reduces an effective touch baseline capacitance of the touch node (e.g., of the touch sensor).

In some examples, each respective touch node of the touch screen can include an Rx electrode, a +Tx electrode (e.g., one or more +Tx electrodes), and a −Tx electrode (e.g., one or more −Tx electrodes), optionally in the same layer, and include expanded portions of a bridge and/or additional electrodes of the bridge in a different layer. For example, the expanded portions of the bridge and/or the additional electrodes of the bridge can be disposed under the one or more −Tx electrodes. Other arrangements of the expanded portions of the bridge and/or the additional electrodes of the bridge are contemplated.

A variety of arrangements of +Tx, −Tx, and Rx electrodes can be used, for example, and the relative position of the +Tx, −Tx, and Rx electrodes can be different in different arrangements. For example, a touch sensor arrangement could include a distance between the −Tx electrode and the Rx electrode being smaller than a distance between the +Tx electrode and the Rx electrode, and a technique for reducing the effective touch baseline capacitance can be applied in such an arrangement.

FIG. 1 illustrates a simplified diagram of a touch sensor including a differential transmitter (e.g., Tx 10) and a receiver (e.g., Rx 13). The differential transmitter drives (e.g., stimulates) two drive electrodes (e.g., +Tx electrode 14 and −Tx electrode 16), and the receiver includes an Rx electrode 12. FIG. 1 also illustrates representations of some mutual capacitances therebetween. The touch sensor of FIG. 1 can be used in a touch sensor panel that uses a differential drive technique for mutual capacitance touch sensing and that implements a baseline capacitance reduction technique according to some examples of the disclosure. For example, the touch sensor of FIG. 1 is optionally utilized in the example computer systems described with reference to FIGS. 6A-6E and/or in the computing system described with reference to FIG. 7 (e.g., the computing system 200 of FIG. 7).

The diagram of FIG. 1 includes two capacitive paths between differential transmitter 10 and receiver 13. One capacitive path represents mutual capacitance coupling between a first drive electrode, namely, +Tx electrode 14 (labeled as the node "DM"), and a Rx electrode 12 (labeled as the node "SM"). In some examples, +Tx electrode 14 represents one or more first drive electrodes (e.g., one or more first drive lines). A second capacitive path represents a mutual capacitance coupling between a second drive electrode, namely, −Tx electrode 16 (labeled as the node "DC") and a Rx electrode 12. In some examples, −Tx electrode 16 represents one or more second drive electrodes (e.g., one or more second drive lines).

The effective touch baseline capacitance of the touch node of a mutual capacitance touch sensor is optionally given by Expression (1) below:

$$C\text{sig\_eff}=\text{CDMSM}-\text{CDCSM} \qquad (1)$$

where Csig_eff refers to the effective touch baseline capacitance, CDMSM refers to the capacitance between the +Tx electrode 14 and the Rx electrode 12 (e.g., first mutual capacitance), and CDCSM refers to the capacitance between the −Tx electrode 16 and the Rx electrode 12 (e.g., second mutual capacitance).

Figure 2:
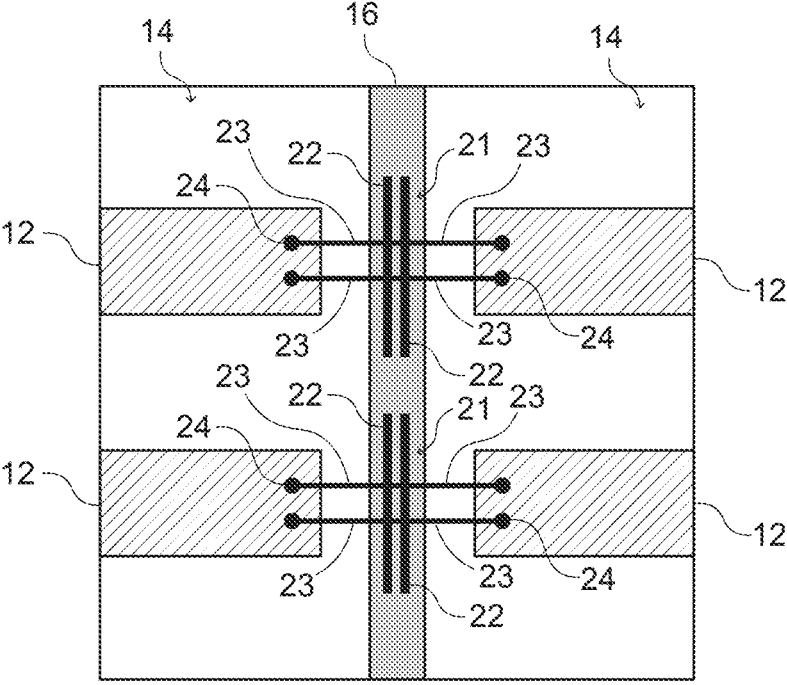
FIG. 2 illustrates an example unit touch node design of a touch node of a touch sensor, where the touch node includes bridge portions for implementing a touch baseline capacitance reduction technique, according to some examples of the disclosure.

In some examples, the +Tx electrodes, −Tx electrodes, and Rx electrodes are disposed in the same, first layer of the touch sensor, and the distance in the first layer between the +Tx electrode and the Rx electrode is optionally less than a distance between the −Tx electrode and the Rx electrode, such as shown in FIG. 2. In such an arrangement, because the capacitance is inversely proportional to the distance, the first mutual capacitance is greater than the second mutual capacitance. To compensate for the first mutual capacitance being greater than the second mutual capacitance (e.g., to compensate for the difference between the first mutual capacitance and the second mutual capacitance being beyond a threshold value) and thus reduce the effective touch baseline capacitance of the touch sensor, some of the disclosed examples include techniques for increasing the second mutual capacitance.

The output of the differential transmitter 10 of FIG. 1 can include drive signals, which can be alternating current (AC) voltages. The waveforms of drive signals applied to the +Tx electrode 14 and −Tx electrode 16 can have the same amplitude and frequency, but different phases (e.g., opposite phases). In some examples, to enable reduction in the baseline capacitances, the drive signals can be complimentary and have phases with opposite polarity. When stimulated by the differential drive signals, a first mutual capacitance forms between the +Tx electrode 14 and the Rx electrode 12 (e.g., between DM and SM in FIG. 1) and a second mutual capacitance forms between the −Tx electrode 16 and the Rx electrode 12 (e.g., between DC and SM in FIG. 1). CDMSM 18 (e.g., the first mutual capacitance) refers to the capacitance between the +Tx electrode 14 and the Rx electrode 12 and CDCSM 20 (e.g., the second mutual capacitance) refers to the capacitance between the −Tx electrode 16 and the Rx electrode 12.

One (or both) of the aforementioned mutual capacitances may change based on a capacitance between the touch node and an object (e.g., touching or in proximity to the touch node). For example, a grounded finger touching or in proximity to a touch node can reduce (or otherwise change or influence) the mutual capacitance measured at the receiver 13 because the grounded finger provides an alternative capacitance path. The change in capacitance resulting from an object touching or in proximity to the touch node is optionally relatively small relative to the baseline mutual capacitance (e.g., is relatively small relative to the difference between CDMSM 18 and CDCSM 20). In some examples, due to the arrangement of the electrodes of the touch node, the change in capacitance due to a touch detected on the touch sensor or due to an object in proximity to the touch sensor is most reflected in the change in the mutual capacitance between the +Tx electrode and the Rx electrode (e.g., the first mutual capacitance or CDMSM 18 described above). Specifically, in some examples, the mutual capacitance is greater between +Tx electrode and the Rx electrode than the mutual capacitance between the −Tx electrode and the Rx electrode optionally due to the +Tx electrode and the Rx electrode being closer in distance compared to a distance between the −Tx electrode and the Rx electrode of the touch node and/or optionally due to the +Tx electrode being greater in surface area compared to a surface area of the −Tx electrode. Thus, when a finger (e.g., an object) is detected on or near the touch node, the capacitance CDMSM 18 is optionally modulated more than the capacitance CDCSM 20.

Figure 3:
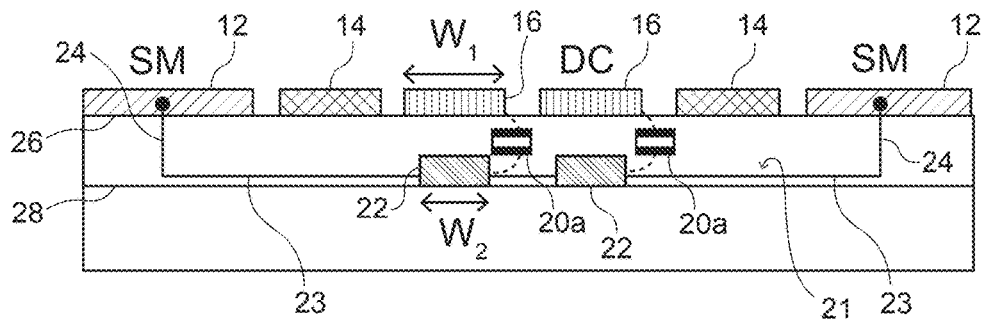
FIG. 3 illustrates a cross sectional view of the arrangement of the example unit touch node design of FIG. 2, according to some examples of the disclosure.

FIG. 2 illustrates an example unit touch node design, which includes bridges (e.g., including additional electrodes and/or expanded portions of bridges) to implement a touch baseline capacitance reduction technique, according to some examples of the disclosure. FIG. 3 illustrates a cross sectional view of the arrangement of the example unit touch node design of FIG. 2 according to some examples of the disclosure. The unit touch node design of FIG. 2 can be extended to create additional touch nodes, such as a two-dimensional array of touch nodes. In some examples, the example unit touch node design of FIG. 2 shows a pair of example unit touch node designs (e.g., two of the same unit touch node designs).

In FIG. 2, the unit touch node includes +Tx electrodes 14, Rx electrodes 12, and −Tx electrodes 16 disposed on a first layer (e.g., first layer 26 in FIG. 3). For example, the first layer is a metal mesh layer, and the touch electrodes are formed from metal mesh optionally to enable human visibility of images on the display that is optionally below the touch sensor panel (e.g., light from light emitting components of a display passes through openings in the metal mesh). In FIG. 2, the +Tx electrodes 14 and the −Tx electrodes 16 extend along a first axis (e.g., a vertical axis parallel to the first layer). In FIG. 2, the Rx electrodes 12 (e.g., Rx electrode segments) extend along a different axis (e.g., a horizontal axis parallel to the first layer). Although not shown in FIG. 2, the +Tx electrodes 14 can optionally be electrically connected at an edge of the touch sensor panel (e.g., top or bottom) or electrically connected using one or more vias in a different, second layer (e.g., a second metal mesh layer). Thus, electrically, the two +Tx electrodes 14 illustrated in FIG. 2 can optionally represent segments of one drive electrode driven with a first drive signal. In FIG. 2, Rx electrodes 12 are shown as multiple Rx electrode segments, which are electrically connected at an edge of the touch sensor panel (e.g., left or right, not shown), and/or are electrically connected using portions of bridges 21 that bridge between the first and second layers using one or more vias between the first layer and the second layer described above. Bridges 21 are further illustrated and described with reference to FIG. 3.

In FIGS. 2-3, the bridges 21 include first bridge portions 23 (e.g., routings) disposed on the second layer 28 (e.g., of FIG. 3), second bridge portions 24 including vias that connect to the Rx electrodes 12, and third bridge portions 22, which expand under and parallel to the –Tx electrodes 16. In some examples, the third bridge portions 22 correspond to additional electrodes. As shown in FIGS. 2-3, for a respective Rx electrode 12 (e.g., a respective Rx electrode segment), a distance between a nearest +Tx electrode 14 (e.g., a +Tx electrode 14 that is nearest in distance to the respective Rx electrode 12) and the respective Rx electrode 12 is less than a distance between a nearest –Tx electrode 16 (e.g., a –Tx electrode 16 that is nearest in distance to the respective Rx electrode 12) and the respective Rx electrode 12, which optionally results in a capacitive coupling between the +Tx electrodes 14 and the Rx electrodes 12 that is greater in amount than a capacitive coupling between the –Tx electrodes 16 and the Rx electrodes 12 (e.g., results in the first mutual capacitance described above being greater than the second mutual capacitance described above). Thus, techniques for increasing an amount of capacitive coupling of the –Tx electrodes 16 and the Rx electrode 12 (e.g., for increasing the second mutual capacitance (e.g., CDCSM 20 as described with reference to FIG. 1 and/or Expression 1) would be useful for reducing the effective touch baseline capacitance (e.g., Csig_eff of Expression 1) of the touch sensor.

In some examples, the bridges 21 provides the touch sensor with an additional capacitive coupling for reducing the effective touch baseline capacitance of the touch sensor. In some examples, without bridges 21, the effective touch baseline capacitance of the touch sensor is in accordance with Expression 1, which is provided again here for reference:

$$Csig\_eff = CDMSM - CDCSM \quad (1)$$

where Csig_eff refers to the effective touch baseline capacitance, CDMSM refers to the capacitance between the +Tx electrode 14 and the Rx electrode 12 (e.g., first mutual capacitance), and CDCSM refers to the capacitance between the –Tx electrode 16 and the Rx electrode 12 (e.g., second mutual capacitance). In some examples, when the touch sensor includes the bridges 21 (e.g., the third bridge portions 22), the effective touch baseline capacitance of the touch sensor is in accordance with Expression 2:

$$Csig\_eff = CDMSM - CDCSM - CDCSM_{(bridges)} \quad (2)$$

where Csig_eff refers to the effective touch baseline capacitance, CDMSM refers to the capacitance between the +Tx electrode 14 and the Rx electrode 12 (e.g., first mutual capacitance), CDCSM refers to the capacitance between the –Tx electrode 16 and the Rx electrode 12 (e.g., second mutual capacitance), and CDCSM_{(bridges)} reference to the capacitance between the bridges 21 (e.g., the third bridge portions 22) and the –Tx electrode 16. Thus, the effective touch baseline capacitance of the touch sensor (e.g., of FIGS. 2-3) is further minimized or reduced in the touch sensor due to the addition of the third bridge portions 22. In other words, due to the addition of the third bridge portions 22, CDCSM of Expression 1, effectively becomes the sum of CDCSM and CDCSM_{(bridges)}, thereby reducing Csig_eff, such as shown by Expression 2.

As described above, in some examples, the third bridge portions 22 of FIG. 2 optionally correspond to additional electrodes, which, as shown in FIG. 3, are parallel to –Tx electrodes 16 and are disposed on a second layer (e.g., layer 28 in FIG. 3) of the corresponding touch node. In some examples, the third bridge portions 22 are electrically connected to the Rx electrodes 12 via the first and/or second bridge portions (e.g., the first bridge portions 23 and the second bridge portions 24 described above), thereby creating additional capacitive coupling between –Tx electrode 16 and Rx electrode 12, and therefore reducing the effective baseline touch capacitance of the touch sensor (e.g., reducing Csig_eff of Expression 1). Additionally or alternatively, the third bridge portions 22 optionally correspond to portions of bridges 21 that expand under or near the –Tx electrodes 16. In some examples, because the expanded portions of the bridges 21 and/or the additional electrodes of the bridges 21 are electrically connected to the sense electrode (e.g., the Rx electrode via the first and/or second bridge portions described above), the effective touch baseline capacitance of the touch sensor is reduced. Thus a touch baseline capacitance of the touch sensor with the bridges (e.g., including third bridge portions 22) according to Expression 2 is optionally less than a touch baseline capacitance of the touch sensor without the bridges (e.g., without including third bridge portions 22) according to Expression 1.

In particular, the additional parallel plate capacitance between the –Tx electrodes and the expanded portions of the bridges (e.g., the portions of the bridges that expand under –Tx electrodes) and/or the additional electrodes of the bridges 21 (e.g., the additional electrodes of the bridges 21 that are under and parallel to the –Tx electrodes) provides an additional capacitive coupling that effectively further reduces the touch baseline capacitance of the touch sensor (e.g., the touch sensor illustrated in FIGS. 2 and 3). It is understood that the third bridge portions 22 (e.g., the expanded portions of the bridges and/or the additional electrodes of the bridges 21) can have different shapes or arrangements in the touch sensor. Additionally or alternatively, the dimensions (e.g., width and length) of the third bridge portions 22 can be tuned to achieve a desired reduction in the baseline capacitance of the touch sensor. Additional features of the bridges 21 are further illustrated and described with reference to FIG. 3.

Minimizing, eliminating, or decreasing the effective touch baseline capacitance may increase the touch signal-to-noise ratio when detecting an object on or near the touch surface of the touch sensor. In some examples, placing one or more additional electrodes and/or expanding a capacitive coupling between the –Tx electrode 16 and the Rx electrode 12 (e.g., the sense electrode) can introduce an additional amount of capacitance for reducing the effective touch baseline capacitance of the touch sensor. For example, the third bridge portions 22 could be arranged (e.g., disposed) under the –Tx electrodes 16, such as shown in FIG. 3, so as to increase an amount of capacitive coupling of the touch sensor that is due to current that is in phase with the –Tx electrode 16 and thus reduce the effective touch baseline capacitance. Additionally, arranging (e.g., disposing) the third bridge portions 22 underneath the –Tx electrode can some reduce optical impacts from the addition (e.g., inclusion) of the metal mesh of the second layer (e.g., the second layer 28 of FIG. 3) of the touch sensor.

In FIG. 3, +Tx electrodes 14, −Tx electrodes 16, and Rx electrodes 12 are arranged on the first layer 26 (e.g., a first metal mesh layer), while the third bridge portions 22 are located on the second layer 28 (e.g., a second metal mesh layer) and provide the additional amount of capacitance associated with the current that is in phase with −Tx electrodes 16 to reduce Csig_eff, such as described with reference to Expression 2. For example, due to the third bridge portions 22, Csig_eff, which, in some examples, is optionally substantially dominated by CDMSM should the touch sensor not include third bridge portions 22, is reduced due to the additional capacitive coupling between first layer 26 and second layer 28 provided by the third bridge portions 22. For example, the third bridge portions 22 on the second layer 28 are arranged under −Tx electrodes 16 to create an additional capacitance that is due to current driven in the phase corresponding to (the drive signal applied to) the −Tx electrodes 16. For example, as discussed earlier, in some examples, the phase of drive signals applied to the +Tx electrode 14 and the −Tx electrode 16 are opposite in polarity, so the current between the +Tx electrode 14 to the Rx electrode 12 and the current between the −Tx electrode 16 and the Rx electrode 12 are opposite in polarity, thus canceling out each other and causing reduction in the effective touch baseline capacitance. Effectively, the third bridge portions 22 help create an additional parallel plate capacitance (e.g., capacitance 20$a$ in FIG. 3, which further corresponds to CDCSM$_{(bridges)}$ in Expression 2) that is due to current that is in phase with the −Tx electrode 16, thereby reducing the effective touch baseline capacitance of the touch sensor (e.g., Csig_eff of Expression 2). In some examples, the third bridge portions 22 expand orthogonal to the first bridge portions 23 and the second bridge portions 24 that connect segments of the Rx electrodes 12, such as shown in FIG. 2.

It should be noted that, in some examples, the additional capacitance that is introduced to the touch sensor due to the third bridge portions 22, which reduces the effective touch baseline capacitance of the touch sensor, does not modulate in capacitance as much (e.g., as much as CDMSM 18 and/or CDCSM 20) when an external object touches or is in proximity to the touch sensor. For example, the −Tx electrode 16 is further in distance from the Rx electrode 12 than the +Tx electrode 14, which by design optionally results in a mutual capacitance in the first layer for the −Tx electrode 16 (e.g., causes the second mutual capacitance (e.g., CDCSM 20 of FIG. 1, CDCSM in Expression 1, and/or CDCSM in Expression 2)) being less than the first mutual capacitance (e.g., CDMSM 18 since capacitance is generally inversely proportional to distance). Additionally, the third bridge portions 22 are in the second layer 28, and thus are more distant from an external object than the −Tx electrode 16 in the first layer 26, which shields the third bridge portions 22 from some or most (or all) of the capacitance change due to the external object. Thus, in some examples, the additional capacitance that is introduced to the touch sensor with the third bridge portions 22 is optionally not substantially modulated by capacitance changes that are due to object detection via the touch node.

In addition, it should be noted that, in some examples, a width (e.g., W$_1$ in FIG. 3) of a respective −Tx electrode 16 can be different from a width (e.g., W$_2$ in FIG. 3) of a respective third bridge portion 22. In some examples, the width (e.g., W$_1$ in FIG. 3) of the respective −Tx electrode 16 is greater than the width (e.g., W$_2$ in FIG. 3) of the respective third bridge portion 22. For example, a width (e.g., W$_1$ in FIG. 3) of a −Tx electrode 14 is optionally 5 μm and a width of a third bridge portion 22 is optionally 3 μm, or is another width that is less than the width (e.g., W$_1$ in FIG. 3) of the −Tx electrode 14. In some examples, the width (e.g., W$_2$ in FIG. 3) of the third bridge portion 22 is less than the width (e.g., W$_1$ in FIG. 3) of the −Tx electrode 14 to reduce optical impact on the display from the metal mesh in the second layer (e.g., the second layer 28 in FIG. 3).

Figure 4:
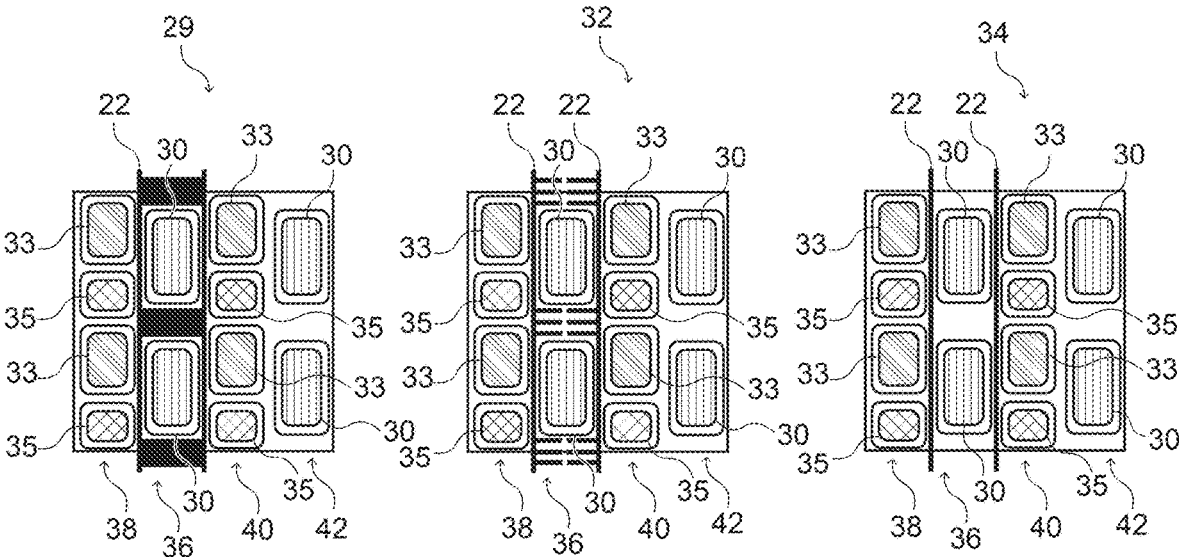
FIG. 4 illustrates different patterns for portions of bridges in a second layer of a touch sensor that implements a touch baseline capacitance reduction technique, according to some examples of the disclosure.

FIG. 4 illustrates three different patterns for third bridge portions 22 (e.g., expanded portions and/or additional electrodes) in a second layer (e.g., the second layer 28 in FIG. 3) of a touch sensor, according to some examples of the disclosure. FIG. 4 shows a first pattern 29, a second pattern 32, and a third pattern 34. It should be noted that other patterns of the third bridge portions 22 are contemplated.

The touch sensor panels in which the first pattern 29, the second pattern 32, and the third pattern 34 are disposed include a plurality of LEDs (e.g., red LED 35, green LED 33, and blue LED 30), around which the first pattern 29, the second pattern 32, and the third pattern 34 are disposed (e.g., around which the metal mesh electrodes are disposed). Additionally, FIG. 4 shows representations of the third bridge portions 22 (e.g., expanded portions and/or additional electrodes), which can be implemented in the second layer (e.g., a metal mesh layer) of the respective touch sensor panel in which the respective pattern of the third bridge portions 22 appears in FIG. 4. For ease of illustration, the remainder of the bridge or horizontal portions of the bridge (e.g., the first bridge portions 23 and the second bridge portions 24) are not shown in FIG. 4. In some examples, as shown in the third pattern 34 for the third bridge portions 22 (e.g., the rightmost pattern in FIG. 4), the third bridge portions 22 are disposed vertically in a similar manner as shown in FIG. 2 (e.g., as shown with the vertical disposal of the third bridge portions 22 in FIG. 2).

In some examples, the LEDs of the touch sensor panel are not equally distributed across the touch sensor panel, such as shown with the pattern of the arrangement of LEDs in the touch sensor panels in FIG. 4. For example, as shown in the touch sensor panels illustrated in FIG. 4, LEDs that are vertically arranged along section 36 (and/or section 42) of the touch sensor panels, which include blue LED 30, have more space in between a respective LED, than the LEDs that are arranged vertically along section 38 and/or section 40. In some examples, due to the increased spacing between some of the LEDs (e.g., blue LEDs) of the touch sensor panels, the metal mesh area of the third bridge portions 22 can be increased in these spaces (e.g., compared to other spaces of the touch sensor panel. For example, the first pattern 29 and the second pattern 32 (e.g., the left-most and center patterns in FIG. 4) show full or partial filling (e.g., using horizontal and/or vertical metal meshes, etc.) of the spacing between third bridge portions 22 in the section 36 of the respective touch sensor panel optionally to increase the second mutual capacitance and further reduce the effective touch baseline capacitance of the touch sensor. For example, the center pattern in FIG. 4 (e.g., the second pattern 32) uses horizontal portions that extend partially between the primary vertical portions of the third bridge portions 22 shown in the right-most pattern (e.g., the third pattern 34). In contrast, the left-most pattern (e.g., the first pattern 29) has third bridge portions 22 that include vertical portions that bridge the gap between the primary vertical portions of the third bridge portions 22 shown in the right-most pattern (e.g., the third pattern 34). In some examples, the third bridge portions 22 structurally expand vertically and/or horizontally, as described with reference to the first pattern 29, the second pattern 32, and/or the third pattern 34 for the third bridge portions 22 in FIG. 4.

Figure 5:
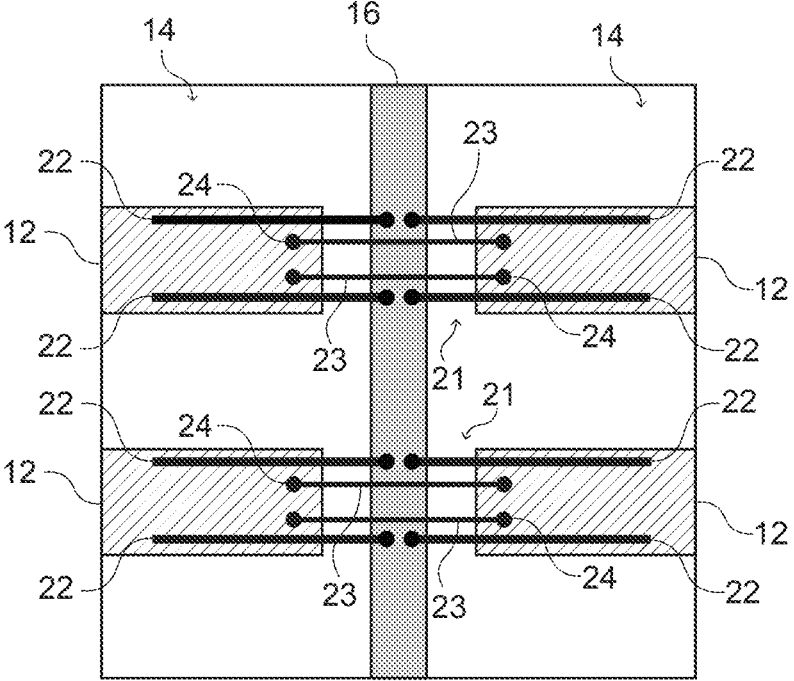
FIG. 5 illustrates another example unit touch node design of a touch node of a touch sensor, where the touch node includes bridge portions for implementing a touch baseline capacitance reduction technique, according to some examples of the disclosure.

FIG. 5 illustrates another example a unit touch node design, which includes third bridge portions (e.g., expanded portions and/or additional electrodes) to implement a touch baseline capacitance reduction technique, according to some examples of the disclosure. In some examples, the example unit touch node design of FIG. 2 shows a pair of example unit touch node designs (e.g., two of the same unit touch node designs). Although FIGS. 2-4 primarily focus on increasing the second mutual capacitance using third bridge portions 22 that include vertical portions in the second layer (electrically coupled to the Rx electrodes using the first and second bridge portions described above (e.g., vias)) in proximity to the −Tx electrodes 16 (e.g., underneath the −Tx electrodes 16), additionally or alternatively, in some examples, the second mutual capacitance can be effectively increased using third bridge portions 22 that include horizontal portions in the second layer (that, optionally, are or are not electrically coupled to the −Tx electrode using vias) in proximity to the Rx electrodes 12. In FIG. 5, the unit touch node includes +Tx electrodes 14, Rx electrodes 12, and −Tx electrodes 16 disposed on a first layer (e.g., first layer 26 in FIG. 3). Additionally, in FIG. 5, the bridges 21 include first bridge portions 23 (e.g., routings) disposed on a second layer (e.g., the second layer 28 in FIG. 3), second bridge portions 24 including vias that connect to the Rx electrodes 12 (e.g., that touch two sense electrode segments, respectively), and third bridge portions 22 that are electrically coupled to the −Tx electrodes 16 in the first layer (e.g., optionally through electrical vias that connect the third bridge portions 22 to the −Tx electrodes 16) and extend under the Rx electrodes 12 to increase the parallel plate capacitance therebetween and reduce the effective baseline capacitance of the touch node. The third bridge portions 22 of FIG. 5 extend (e.g., structurally expand) parallel to the Rx electrode segments and the third bridge portions 22 of FIG. 2 extend (e.g., structurally expand) parallel to the −Tx electrodes 16. In the illustrated example of FIG. 5, the third bridge portions 22 are not in physical contact with the first bridge portions 23 or the second bridge portions 24. Other arrangements of bridge portions are contemplated.

Figure 5A:
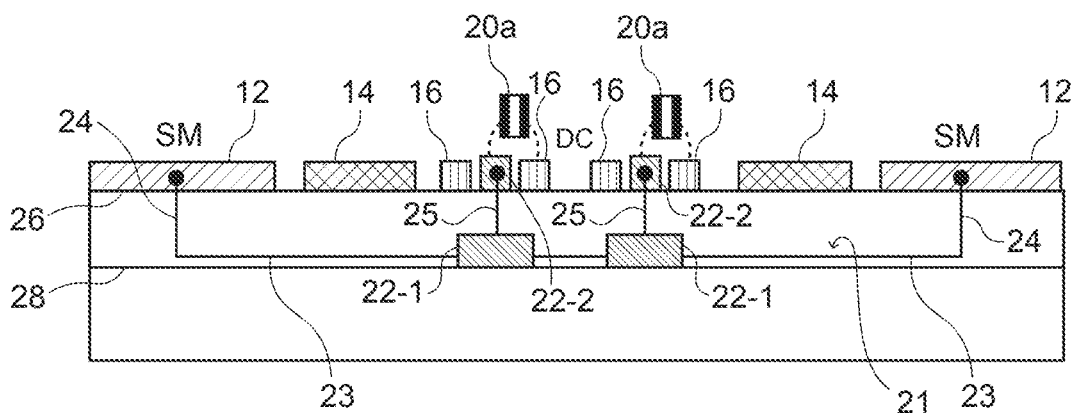
FIG. 5A illustrates a cross sectional view of another arrangement of an example unit touch node design, according to some examples of the disclosure.

FIG. 5A illustrates a cross sectional view of another arrangement of an example unit touch node design, according to some examples of the disclosure. In FIG. 5A, the third bridge portions 22 include portions that are disposed on the first layer 26 in between segments of the −Tx electrodes 16. For example, in FIG. 5A, the bridges include portions 22-1 (e.g., expanded portions and/or additional electrodes) that extend on the second layer 28 and portions 22-2 (e.g., expanded portions and/or additional electrodes) that extend on the first layer 26. In FIG. 5A, the bridges also include the first bridge portions 23 and the second bridge portions 24. The portions 22-2 help to provide additional capacitances 20b that are due to current that is in phase with the −Tx electrodes 16, thereby reducing the effective touch baseline capacitance of the touch sensor (e.g., Csig_eff of Expression 2 (e.g., the additional capacitances 20b are included in CDCSM$_{(bridges)}$ of Expression 2)). In some examples, the portions 22-2 include one or more electrical vias (e.g., electrical via 22-3 of FIG. 5B) or are connected to portions 22-1 by one or more electrical vias. As such, in some examples, portions of bridges that are implemented in a touch sensor panel for reducing a baseline touch capacitance of the touch sensor panel can be disposed on the first layer 26. In some examples, in FIG. 5A, the portions 22-2 extend in between different −Tx electrodes 16. Additionally, in some examples, in FIG. 5A, the portions 22-2 that extend on the first layer 26 extend parallel to the −Tx electrodes 16 and/or in another direction relative to the −Tx electrodes 16. In some examples, in FIG. 5A, the portions 22-2 that extend on the first layer 26 extend in between segments of the same −Tx electrodes 16 (e.g., a first portion 22-2 is extending on the first layer 26 in between (and optionally parallel to) two segments of a first −Tx electrode 16 and a second portion 22-2 is extending on the first layer 26 in between (and optionally parallel to) two segments of a second −Tx electrode 16). In some examples, the portions 22-1 on the second layer 28 in FIG. 5A extend parallel to the −Tx electrodes 16 and/or in another direction relative to the −Tx electrodes 16. In some examples, a width of a respective portion 22-1 is different from (e.g., greater than) a width of a respective portion 22-2. In some examples, a respective portion 22-1 that extend on the second layer under a respective portion 22-2 is at least partially also extending on the second layer under one or more of the two segments of a second −Tx electrode 16.

Figure 5B:
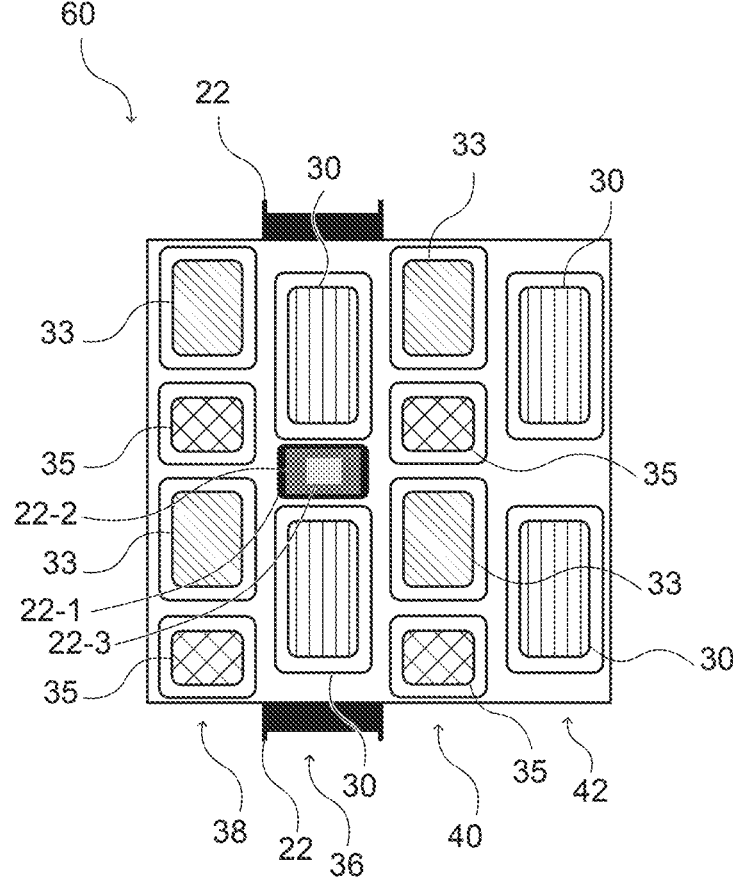
FIG. 5B illustrates another pattern for portions of bridges, where the pattern includes portions of bridges in a first layer of a touch sensor that implements a touch baseline capacitance reduction technique, according to some examples of the disclosure.

FIG. 5B illustrates another example pattern (e.g., a fourth pattern 60) for third bridge portions 22, according to some examples of the disclosure. The touch sensor panel in which the fourth patten 60 is disposed includes a plurality of LEDs (e.g., red LED 35, green LED 33, and blue LED 30), around which the fourth pattern 60 is disposed (e.g., around which the metal mesh electrodes are disposed). The arrangement of the plurality of LEDs in FIG. 5B is as illustrated and/or described with reference to the touch sensor panels in FIG. 4. Additionally, FIG. 5B shows representations of third bridge portions 22 (e.g., expanded portions and/or additional electrodes) that include portions that are implemented in the first layer (e.g., a metal mesh layer) of the touch sensor panel. In particular, in Fig. SB, the portion 22-2 is on the first layer of the touch sensor while the portion 22-1 is on the second layer of the touch sensor. The electrical via 22-3 electrically connects the portion 22-2 to the portion 22-1, optionally in addition to routing(s) that are optionally routed in between the first layer and the second layer, such as the routings 25 in FIG. 5A. In some examples, the electrical via 22-3 is disposed on the first layer to the portion 22-2. As such, in some examples, portions of a bridge can be disposed on the first layer.

In some examples, features of the different unit touch node designs illustrated and/or described in the present disclosure can be combined. For instance, in some examples, features of the unit touch node design illustrated and/or described with reference to FIGS. 5A and 5B can be combined with features of the unit touch node designs that are illustrated and/or described with reference to one or more or all of FIGS. 3-5.

Figures 6A, 6B, 6C, 6D, 6E:
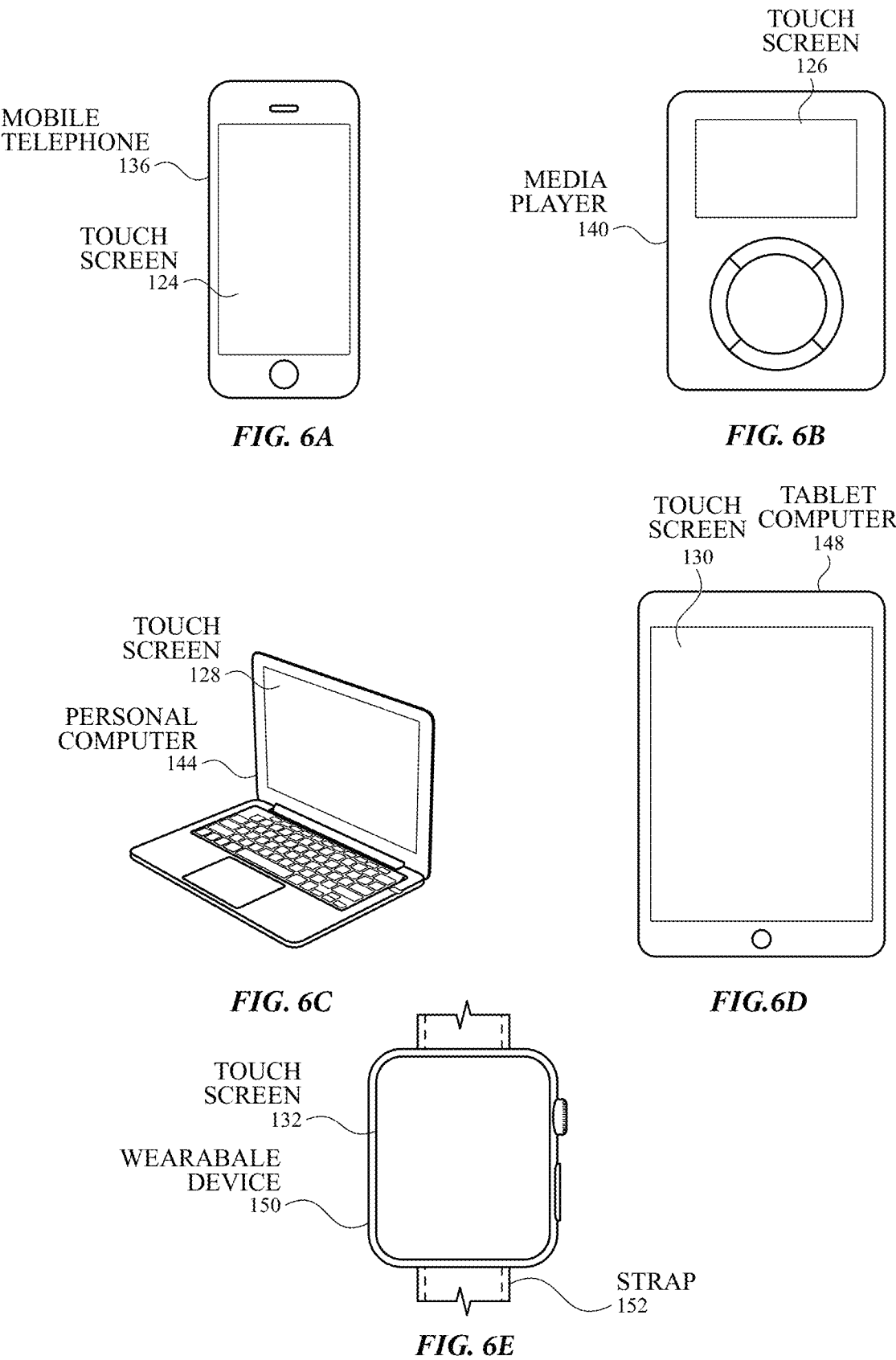
FIGS. 6A-6E illustrate example electronic devices that can each include a touch screen that implements a touch baseline capacitance reduction technique, according to some examples of the disclosure.

FIGS. 6A-6E illustrate example systems that can include a touch screen according to examples of the disclosure. FIG. 6A illustrates an example mobile telephone 136 that includes a touch screen 124 according to examples of the disclosure. FIG. 6B illustrates an example digital media player 140 that includes a touch screen 126 according to examples of the disclosure. FIG. 6C illustrates an example personal computer 144 that includes a touch screen 128 according to examples of the disclosure. FIG. 6D illustrates an example tablet computing device 148 that includes a touch screen 130 according to examples of the disclosure. FIG. 6E illustrates an example wearable device 150 that includes a touch screen 132 and can be attached to a user using a strap 152 according to examples of the disclosure. It is understood that a touch screen can be implemented in other devices as well. In some examples, touch screens 124, 126, 128, 130 and 132 utilize the disclosed techniques for reducing an effective touch baseline capacitance of a mutual capacitance touch sensor.

In some examples, touch screens 124, 126, 128, 130 and 132 can be based on mutual capacitance. A mutual capacitance-based touch system can include electrodes (e.g., +Tx electrodes, −Tx electrodes, and Rx electrodes) arranged as drive and sense lines that may cross over each other on different layers (in a double-sided configuration), or may be adjacent to each other on the same layer (e.g., as described with reference to FIGS. 2, 3, 5, 5A and/or 5B). The crossing or adjacent locations can form touch nodes. During operation, the drive lines can be stimulated with AC waveforms and the mutual capacitance of the touch node can be measured. As an object approaches the touch node, the mutual capacitance of the touch node can change (e.g., decrease). This change in the mutual capacitance of the touch node can be detected and measured by the touch sensing system to determine the positions of multiple objects when they touch, or come in proximity to, the touch screen. In some examples, a mutual capacitance-based touch system can form touch nodes from a matrix of small, individual plates of conductive material.

In some examples, touch screens 124, 126, 128, 130 and 132 of FIG. 6A-6E, respectively, can be based on mutual capacitance and/or self-capacitance. The electrodes can be arranged as a matrix of small, individual plates of conductive material or as drive lines and sense lines, or in another pattern. The electrodes can be configurable for mutual capacitance or self-capacitance sensing or a combination of mutual and self-capacitance sensing. For example, in one mode of operation electrodes can be configured to sense mutual capacitance between electrodes and in a different mode of operation electrodes can be configured to sense self-capacitance of electrodes. In some examples, some of the electrodes can be configured to sense mutual capacitance therebetween and some of the electrodes can be configured to sense self-capacitance thereof.

Figure 7:
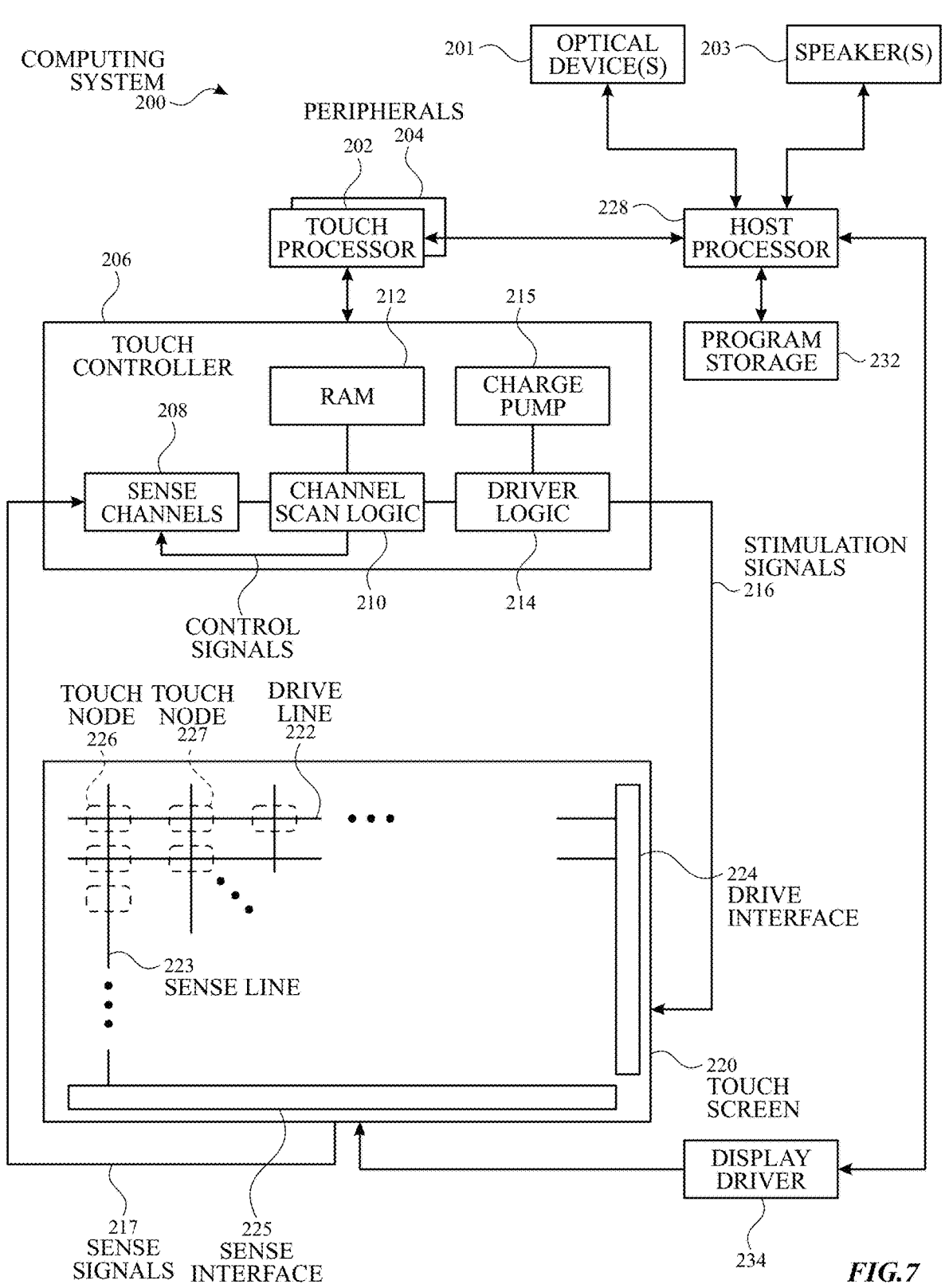
FIG. 7 is a block diagram of an example computing system that illustrates one implementation of an example touch screen that implements a touch baseline capacitance reduction technique, according to some examples of the disclosure.

FIG. 7 illustrates an example computing system including a touch screen that utilizes the disclosed techniques for reducing an effective touch baseline capacitance of a mutual capacitance touch sensor according to examples of the disclosure. Computing system 200 of FIG. 7 can be included in, for example, a mobile phone, tablet, touchpad, portable or desktop computer, portable media player, or wearable device, such as the example electronic devices described with reference to FIGS. 6A-6E, or any mobile or non-mobile computing device that includes a touch screen or touch sensor panel. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208 (e.g., Rx 13 of FIG. 1), channel scan logic 210 and driver logic 214 (e.g., Tx 10 of FIG. 1). Channel scan logic 210 can access RAM 212, autonomously read data from the sense channels and provide control for the sense channels. In addition, channel scan logic 210 can control driver logic 214 to generate stimulation signals 216 at various frequencies and/or phases that can be selectively applied to drive regions of the touch sensing circuitry of touch screen 220, as described in more detail below. In some examples, touch controller 206, touch processor 202 and peripherals 204 can be integrated into a single application specific integrated circuit (ASIC), and in some examples can be integrated with touch screen 220 itself.

It should be apparent that the architecture shown in FIG. 7 is only one example architecture of computing system 200, and that the system could have more or fewer components than shown, or a different configuration of components. In some examples, computing system 200 can include an energy storage device (e.g., a battery) to provide a power supply and/or communication circuitry to provide for wired or wireless communication (e.g., cellular, BLUETOOTH, Wi-Fi, etc.). The various components shown in FIG. 7 can be implemented in hardware, software, firmware, or any combination thereof, including one or more signal processing and/or application specific integrated circuits.

Computing system 200 can include a host processor 228 for receiving outputs from touch processor 202 and performing actions based on the outputs. For example, host processor 228 can be connected to program storage 232 and a display controller/driver 234 (e.g., a Liquid-Crystal Display (LCD) driver). It is understood that although some examples of the disclosure may be described with reference to LCD displays, the scope of the disclosure is not so limited and can extend to other types of displays, such as Light-Emitting Diode (LED) displays, including Organic LED (OLED), Active-Matrix Organic LED (AMOLED) and Passive-Matrix Organic LED (PMOLED) displays. Display driver 234 can provide voltages on select (e.g., gate) lines to each pixel transistor and can provide data signals along data lines to these same transistors to control the pixel display image.

Host processor 228 can use display driver 234 to generate a display image on touch screen 220, such as a display image of a user interface (UI), and can use touch processor 202 and touch controller 206 to detect a touch on or near touch screen 220, such as a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Note that one or more of the functions described herein can be performed by firmware stored in memory (e.g., one of the peripherals 204 in FIG. 7) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some examples, RAM 212 or program storage 232 (or both) can be a non-transitory computer readable storage medium. One or both of RAM 212 and program storage 232 can have stored therein instructions, which when executed by touch processor 202 or host processor 228 or both, can cause the device including computing system 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate, or transport the program for use by or in connection with the instruction execution system, apparatus, or device. The transport medium can include, but is not limited to, an electronic, magnetic, optical, electromagnetic, or infrared wired or wireless propagation medium.

Touch screen 220 can be used to derive touch information at multiple discrete locations of the touch screen, referred to herein as touch nodes. Touch screen 220 can include touch sensing circuitry that can include a capacitive sensing medium having a plurality of drive lines 222 (e.g., +Tx electrodes 14 and −Tx electrodes 16 as illustrated and/or described with reference to FIGS. 1-3 and/or 5) and a plurality of sense lines 223 (e.g., Rx electrodes 12 as illustrated and/or described with reference to FIGS. 1-3, 5, and/or 5A). It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224, and resulting sense signals 217 generated in sense lines 223 can be transmitted through a sense interface 225 to sense channels 208 in touch controller 206. In this way, drive lines and sense lines can be part of the touch sensing circuitry that can interact to form capacitive sensing nodes, which can be thought of as touch picture elements (touch pixels) and referred to herein as touch nodes, such as touch nodes 226 and 227, and such as the touch nodes illustrated and/or described with reference to FIGS. 1-5B. This way of understanding can be particularly useful when touch screen 220 is viewed as capturing an "image" of touch ("touch image"). In other words, after touch controller 206 has determined whether a touch has been detected at each touch nodes in the touch screen, the pattern of touch nodes in the touch screen at which a touch occurred can be thought of as an "image" of touch (e.g., a pattern of fingers touching the touch screen). As used herein, an electrical component "coupled to" or "connected to" another electrical component encompasses a direct or indirect connection providing electrical path for communication or operation between the coupled components. Thus, for example, drive lines 222 may be directly connected to driver logic 214 or indirectly connected to drive logic 214 via drive interface 224 and sense lines 223 may be directly connected to sense channels 208 or indirectly connected to sense channels 208 via sense interface 225. In either case an electrical path for driving and/or sensing the touch nodes can be provided. The simulation signals 216 may include differential drive signals 216 for driving the drive lines at opposite phases.

In some examples, computing system 200 can also include one or more optical devices 201, which may also be referred to herein as optical components. In some examples, the one or more optical devices 201 can include components for light emitting and/or light sensing. In some examples, the one or more optical devices 201 can include light-emitting diodes (e.g., LEDs, OLEDs, etc.), cameras, lasers (e.g., vertical-cavity surface-emitting lasers, etc.), light detectors, photodiodes, and the like. In some examples, the operation of the optical devices can be controlled by host processor 228 or an optical controller (not shown) to perform functionality using the optical devices. The functionality can include, without limitation, projecting light, imaging, proximity sensing and ranging, ambient light sensing, photography, etc., among other possibilities. In some examples, the one or more optical devices 201 can be implemented in proximity to touch screen 220 (e.g., on a periphery of or in a notch region along a perimeter of touch screen 220). As described in more detail herein, in some examples, the one or more optical devices 201 can be integrated with touch screen 220 such that light passes through one or more layers of the touch screen.

In some examples, computing system 200 can also include one or more input and/or output devices, such as speaker 203. It is understood that speaker 203 is an example input and/or output device, but other input and/or output devices are possible. In some examples, the operation of the input and/or output devices, including speaker 203, can be controlled by host processor 228 or an input/output controller (not shown) to perform functionality using the input and/or output devices. The functionality can include audio functionality for speaker 203. In some examples, the one or more input and/or output devices can be implemented in proximity to touch screen 220 (e.g., on a periphery of or in a notch region along a perimeter of touch screen 220). As described in more detail herein, in some examples, the one or more input and/or output devices can be integrated with touch screen 220. For example, integrated speaker 203 with touch screen 220, and having touch screen 220 can include an opening or one or more hole(s), can enable audio to pass through the touch screen.

Therefore, according to the above, some examples are directed to a touch sensor panel. In some examples, the touch sensor panel includes a plurality of touch electrodes in a first layer (e.g., first layer 26 of FIG. 3) including a plurality of first drive electrodes along a first axis, a plurality of second drive electrodes along the first axis, and a plurality of sense electrodes formed of sense electrode segments along a second axis, different from the first axis, and a plurality of bridges in a second layer (e.g., second layer 28 in FIG. 3), different from the first layer, the plurality of bridges including one or more portions along the second axis configured to electrically connect the sense electrode segments to form the plurality of sense electrodes, and one or more portions along the first axis disposed under the plurality of second drive electrodes (e.g., the expanded portions of the bridge and/or the additional electrodes, such as the third bridge portions 22 in FIG. 2 and/or FIG. 3).

In some examples, a first touch node of the touch sensor panel includes a first drive electrode of the plurality of first drive electrodes, a second drive electrode of the plurality of second drive electrodes, and a first sense electrode of the plurality of sense electrodes. In some examples, the first drive electrode is configured to be driven with a first stimulation signal forming a first mutual capacitance between the first drive electrode and the first sense electrode. In some examples, the second drive electrode is configured to be driven with a second stimulation signal having an opposite phase of the first stimulation signal and forming a second mutual capacitance between the second drive electrode and the first sense electrode. In some examples, a baseline mutual capacitance for the first touch node is at least the first mutual capacitance reduced by the second mutual capacitance.

In some examples, the first touch node of the touch sensor panel includes a first bridge of the plurality of bridges. In some examples, the first bridge includes a first portion of the one or more portions along the second axis that is configured to touch two sense electrode segments of the sense electrode segments that form the plurality of sense electrodes, including the first sense electrode, and a first portion of the one or more portions along the first axis disposed under the second drive electrode. In some examples, a third mutual capacitance is formed between the second drive electrode and the first portion of the one or more portions along the first axis disposed under the second drive electrode. In some examples, the baseline mutual capacitance for the first touch node is at least the first mutual capacitance reduced by both the second mutual capacitance and the third mutual capacitance.

In some examples, a width of the second drive electrode is different from a width of the first second portion of the one or more second portions along the first axis disposed under the second drive electrode. In some examples, a length of the first portion of the one or more portions along the first axis disposed under the second drive electrode is greater than a width of the first sense electrode (e.g., a width of a first sense electrode segment of the two sense electrode segments that form the first sense electrode) along the first axis.

In some examples, the first touch node also includes a third drive electrode of the plurality of first drive electrodes and a fourth drive electrode of the plurality of second drive electrodes. In some examples, the first bridge of the first touch node also includes a second portion of the one or more portions along the second axis, different from the first portion of the one or more portions along the second axis, that is configured to touch the two sense electrode segments of the sense electrode segments that form the plurality of sense electrodes, including the first sense electrode. In some examples, the first bridge of the first touch node also includes a second portion of the one or more portions along the first axis, different from the first portion of the one or more portions along the first axis, disposed under the fourth drive electrode. In some examples, the first mutual capacitance of the first touch node is a sum of the mutual capacitance formed between the first drive electrode and the first sense electrode and a mutual capacitance formed between the third drive electrode and the first sense electrode. In some examples, the second mutual capacitance of the first touch node is a sum of the mutual capacitance formed between the second drive electrode and the first sense electrode and a mutual capacitance formed between the fourth drive electrode and the first sense electrode. In some examples, the third mutual capacitance of the first touch node is a sum of the mutual capacitance formed between the second drive electrode and the first portion of the one or more portions along the first axis disposed under the second drive electrode and a mutual capacitance formed between the fourth drive electrode and the second portion of the one or more portions along the second axis disposed under the fourth drive electrode. In some examples, the baseline mutual capacitance for the first touch node is the first mutual capacitance of the first touch node reduced by both the second mutual capacitance and the third mutual capacitance.

Some examples are directed to a touch-sensitive device. In some examples, the touch-sensitive device includes an energy storage device, communication circuitry, a touch controller, and a touch sensor panel. In some examples, the touch sensor panel includes a plurality of touch electrodes in a first layer, including a plurality of first drive electrodes along a first axis, a plurality of second drive electrodes along the first axis, and a plurality of sense electrodes formed of sense electrode segments along a second axis, different from the first axis. In some examples, the touch sensor panel includes a plurality of bridges in a second layer, different from the first layer. In some examples, the plurality of bridges includes one or more portions along the second axis configured to electrically connect the sense electrode segments to form the plurality of sense electrodes and one or more portions along the first axis disposed under the plurality of second drive electrodes.

In some examples, the touch sensor panel includes a first touch node of the touch sensor panel. In some examples, the first touch node includes a first drive electrode of the plurality of first drive electrodes, a second drive electrode of the plurality of second drive electrodes, and a first sense electrode of the plurality of sense electrodes. In some examples, the first drive electrode is configured to be driven with a first stimulation signal forming a first mutual capacitance between the first drive electrode and the first sense electrode. In some examples, the second drive electrode is configured to be driven with a second stimulation signal having an opposite phase of the first stimulation signal and forming a second mutual capacitance between the second drive electrode and the first sense electrode. In some examples, a baseline mutual capacitance for the first touch node is at least the first mutual capacitance reduced by the second mutual capacitance.

In some examples, the first touch node of the touch sensor panel includes a first bridge of the plurality of bridges. In some examples, the first bridge includes a first portion of the one or more portions along the second axis that is configured to touch two sense electrode segments of the sense electrode segments that form the plurality of sense electrodes, including the first sense electrode and a first portion of the one or more portions along the first axis disposed under the second drive electrode. In some examples, a third mutual capacitance is formed between the second drive electrode and the first portion of the one or more portions along the first axis disposed under the second drive electrode. In some examples, the baseline mutual capacitance for the first touch node is at least the first mutual capacitance reduced by both the second mutual capacitance and the third mutual capacitance.

In some examples, a width of the second drive electrode is different from a width of the first portion of the one or more portions along the first axis disposed under the second drive electrode. In some examples, a length of the first portion of the one or more portions along the first axis disposed under the second drive electrode is greater than a width of the first sense electrode (e.g., a width of a first sense electrode segment of the two sense electrode segments that form the first sense electrode) along the first axis.

In some examples, the first touch node also includes a third drive electrode of the plurality of first drive electrodes and a fourth drive electrode of the plurality of second drive electrodes. In some examples, the first bridge of the first touch node also includes a second portion of the one or more portions along the second axis, different from the first portion of the one or more portions along the second axis, that is configured to touch the two sense electrode segments of the sense electrode segments that form the plurality of sense electrodes, including the first sense electrode. In some examples, the first bridge of the first touch node also includes a second portion of the one or more portions along the first axis, different from the first portion of the one or more portions along the first axis, disposed under the fourth drive electrode. In some examples, the first mutual capacitance of the first touch node is a sum of the mutual capacitance formed between the first drive electrode and the first sense electrode and a mutual capacitance formed between the third drive electrode and the first sense electrode. In some examples, the second mutual capacitance of the first touch node is a sum of the mutual capacitance formed between the second drive electrode and the first sense electrode and a mutual capacitance formed between the fourth drive electrode and the first sense electrode. In some examples, the third mutual capacitance of the first touch node is a sum of the mutual capacitance formed between the second drive electrode and the first portion of the one or more portions along the first axis disposed under the second drive electrode and a mutual capacitance formed between the fourth drive electrode and the second portion of the one or more portions along the second axis disposed under the fourth drive electrode. In some examples, the baseline mutual capacitance for the first touch node is the first mutual capacitance of the first touch node reduced by both the second mutual capacitance and the third mutual capacitance.

In some examples, the baseline mutual capacitance for the first touch node is the first mutual capacitance of the first touch node reduced by both the second mutual capacitance and the third mutual capacitance. In some examples, the touch-sensitive device includes a touch screen that comprises a display that has an active area, and the touch sensor panel is formed over the active area of the display.

Some examples are directed to a touch screen. In some examples, the touch screen includes a display having an active area (e.g., a visible area of the display in a touch screen), and a touch sensor panel formed over the active area of the display. In some examples, the touch sensor panel includes a plurality of touch electrodes in a first layer, including a plurality of first drive electrodes along a first axis, a plurality of second drive electrodes along the first axis, and a plurality of sense electrodes formed of sense electrode segments along a second axis, different from the first axis. In some examples, the touch sensor panel includes a plurality of bridges in a second layer, different from the first layer. In some examples, the plurality of bridges includes one or more portions along the second axis configured to electrically connect the sense electrode segments to form the plurality of sense electrodes and one or more portions along the first axis disposed under the plurality of second drive electrodes.

In some examples, the touch sensor panel includes a first touch node of the touch sensor panel. In some examples, the first touch node includes a first drive electrode of the plurality of first drive electrodes, a second drive electrode of the plurality of second drive electrodes, and a first sense electrode of the plurality of sense electrodes. In some examples, the first drive electrode is configured to be driven with a first stimulation signal forming a first mutual capacitance between the first drive electrode and the first sense electrode. In some examples, the second drive electrode is configured to be driven with a second stimulation signal having an opposite phase of the first stimulation signal and forming a second mutual capacitance between the second drive electrode and the first sense electrode. In some examples, a baseline mutual capacitance for the first touch node is at least the first mutual capacitance reduced by the second mutual capacitance.

In some examples, the first touch node of the touch sensor panel includes a first bridge of the plurality of bridges. In some examples, the first bridge includes a first portion of the one or more portions along the second axis that is configured to touch two sense electrode segments of the sense electrode segments that form the plurality of sense electrodes, including the first sense electrode and a first portion of the one or more portions along the first axis disposed under the second drive electrode. In some examples, a third mutual capacitance is formed between the second drive electrode and the first portion of the one or more portions along the first axis disposed under the second drive electrode. In some examples, the baseline mutual capacitance for the first touch node is at least the first mutual capacitance reduced by both the second mutual capacitance and the third mutual capacitance.

In some examples, the first touch node also includes a third drive electrode of the plurality of first drive electrodes and a fourth drive electrode of the plurality of second drive electrodes. In some examples, the first bridge of the first touch node also includes a second portion of the one or more portions along the second axis, different from the first portion of the one or more portions along the second axis, that is configured to touch the two sense electrode segments of the sense electrode segments that form the plurality of sense electrodes, including the first sense electrode. In some examples, the first bridge of the first touch node also includes a second portion of the one or more portions along the first axis, different from the first portion of the one or more portions along the first axis, disposed under the fourth drive electrode. In some examples, the first mutual capacitance of the first touch node is a sum of the mutual capacitance formed between the first drive electrode and the first sense electrode and a mutual capacitance formed between the third drive electrode and the first sense electrode. In some examples, the second mutual capacitance of the first touch node is a sum of the mutual capacitance formed between the second drive electrode and the first sense electrode and a mutual capacitance formed between the fourth drive electrode and the first sense electrode. In some examples, the third mutual capacitance of the first touch node is a sum of the mutual capacitance formed between the second drive electrode and the first portion of the one or more portions along the first axis disposed under the second drive electrode and a mutual capacitance formed between the fourth drive electrode and the second portion of the one or more portions along the second axis disposed under the fourth drive electrode. In some examples, the baseline mutual capacitance for the first touch node is the first mutual capacitance of the first touch node reduced by both the second mutual capacitance and the third mutual capacitance.

Some examples are directed to a touch sensor panel. In some examples, the touch sensor panel includes, in a first layer, a first drive electrode, a second drive electrode configured to be driven opposite in phase from a phase applied to the first drive electrode, and a sensing electrode (e.g., connected by a bridge in a second layer). The touch sensor panel includes, in a second layer, an additional electrode configured to increase an additional capacitive coupling between the second drive electrode and the sensing electrode in order to reduce an effective touch baseline capacitance.

Some examples are directed to a touch sensor panel. In some examples, the touch sensor panel includes a plurality of touch electrodes in a first layer, including a plurality of first drive electrodes along a first axis, a plurality of second drive electrodes along the first axis, and a plurality of sense electrodes formed of sense electrode segments along a second axis, different from the first axis. In some examples, the touch sensor panel includes a plurality of bridges in a second layer, different from the first layer. In some examples, the plurality of bridges includes one or more first portions along the second axis configured to electrically connect the sense electrode segments to form the plurality of sense electrodes, and one or more second portions along the second axis electrically connected to the plurality of second drive electrodes. In some examples, the one or more second portions extend (e.g., structurally extend) from the plurality of second drive electrodes to the plurality of sense electrodes.

Some examples are directed to a touch sensor panel. In some examples, the touch sensor panel includes a plurality of touch electrodes in a first layer including a plurality of first drive electrodes along a first axis, a plurality of second drive electrodes along the first axis, and a plurality of sense electrodes formed of sense electrode segments along a second axis. The touch sensor panel includes a plurality of bridges in a second layer. Optionally the plurality of bridges includes one or more portions along the second axis (e.g., parallel to the second axis) configured to electrically connect the sense electrode segments to form the plurality of sense electrodes, and includes one or more portions along the first axis (e.g., parallel to the second axis) disposed under the one or more second drive electrodes. Optionally the plurality of bridges includes one or more additional electrodes, which are electrically connected to one or more of the plurality of second drive electrodes, in the second layer along the second axis, and the one or more additional electrodes are disposed under the one or more sense electrode segments (e.g., the one or more additional electrodes include portions that are disposed under the plurality of sense electrode segments).

Some examples are directed to a touch sensor panel. In some examples, the touch sensor panel includes a plurality of touch electrodes in a first layer (e.g., first layer 26 of FIG. 5A) including a plurality of first drive electrodes along a first axis and a plurality of second drive electrodes along the first axis. The plurality of second drive electrodes is optionally formed of second drive electrode segments (e.g., along the first axis). The touch sensor panel also includes a plurality of sense electrodes formed of sense electrode segments along a second axis, different from the first axis, and includes a plurality of bridges. The plurality of bridges includes one or more portions in the first layer in between second drive electrodes of the plurality of second drive electrodes and/or include one or more portions in the first layer in between the second drive electrode segments that form the plurality of second drive electrodes. In some examples, the plurality of bridges includes one or more portions in a second layer (e.g., second layer 28 in FIG. 5A) that is different from the first layer. In some examples, in the second layer, the plurality of bridges includes one or more portions along the second axis configured to electrically connect the sense electrode segments to form the plurality of sense electrodes and one or more portions along the first axis disposed under the one or more portions of the plurality of bridges that are in the first layer. In some examples, the one or more portions of the plurality of bridges that are in the first layer are electrically connected, via one or more electrical vias, to the one or more portions of the plurality of bridges along the first axis disposed under the one or more portions of the plurality of bridges.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A touch sensor panel comprising:
   a plurality of touch electrodes in a first layer, including:
      a plurality of first drive electrodes along a first axis,
      a plurality of second drive electrodes along the first axis, and
      a plurality of sense electrodes formed of sense electrode segments along a second axis, different from the first axis; and
   a plurality of bridges in a second layer, different from the first layer, the plurality of bridges including:
      one or more portions along the second axis configured to electrically connect the sense electrode segments to form the plurality of sense electrodes, and
      one or more portions along the first axis disposed under the plurality of second drive electrodes.

2. The touch sensor panel of claim 1, wherein:
   a first touch node of the touch sensor panel includes:
      a first drive electrode of the plurality of first drive electrodes,
      a second drive electrode of the plurality of second drive electrodes, and
      a first sense electrode of the plurality of sense electrodes;
   the first drive electrode is configured to be driven with a first stimulation signal forming a first mutual capacitance between the first drive electrode and the first sense electrode;
   the second drive electrode is configured to be driven with a second stimulation signal having an opposite phase of the first stimulation signal and forming a second mutual capacitance between the second drive electrode and the first sense electrode; and
   a baseline mutual capacitance for the first touch node is at least the first mutual capacitance reduced by the second mutual capacitance.

3. The touch sensor panel of claim 2, wherein:
   the first touch node of the touch sensor panel includes a first bridge of the plurality of bridges,
   the first bridge includes:
      a first portion of the one or more portions along the second axis that is configured to touch two sense electrode segments of the sense electrode segments that form the plurality of sense electrodes, including the first sense electrode;

a first portion of the one or more portions along the first axis disposed under the second drive electrode;

a third mutual capacitance is formed between the second drive electrode and the first portion of the one or more portions along the first axis disposed under the second drive electrode; and the baseline mutual capacitance for the first touch node is at least the first mutual capacitance reduced by both the second mutual capacitance and the third mutual capacitance.

4. The touch sensor panel of claim 3, wherein a width of the second drive electrode is different from a width of the first portion of the one or more portions along the first axis disposed under the second drive electrode.

5. The touch sensor panel of claim 3, wherein a length of the first portion of the one or more portions along the first axis disposed under the second drive electrode is greater than a width of the first sense electrode along the first axis.

6. The touch sensor panel of claim 3, wherein:

the first touch node also includes:

a third drive electrode of the plurality of first drive electrodes; and a fourth drive electrode of the plurality of second drive electrodes; and the first bridge of the first touch node also includes:

a second portion of the one or more portions along the second axis, different from the first portion of the one or more portions along the second axis, that is configured to touch the two sense electrode segments of the sense electrode segments that form the plurality of sense electrodes, including the first sense electrode;

a second portion of the one or more portions along the first axis, different from the first portion of the one or more portions along the first axis, disposed under the fourth drive electrode;

the first mutual capacitance of the first touch node is a sum of:

the mutual capacitance formed between the first drive electrode and the first sense electrode;

a mutual capacitance formed between the third drive electrode and the first sense electrode;

the second mutual capacitance of the first touch node is a sum of:

the mutual capacitance formed between the second drive electrode and the first sense electrode; and a mutual capacitance formed between the fourth drive electrode and the first sense electrode; and the third mutual capacitance of the first touch node is a sum of:

the mutual capacitance formed between the second drive electrode and the first portion of the one or more portions along the first axis disposed under the second drive electrode; and a mutual capacitance formed between the fourth drive electrode and the second portion of the one or more portions along the second axis disposed under the fourth drive electrode.

7. The touch sensor panel of claim 6, wherein the baseline mutual capacitance for the first touch node is the first mutual capacitance of the first touch node reduced by both the second mutual capacitance and the third mutual capacitance.

8. A touch-sensitive device comprising:

an energy storage device;

communication circuitry;

a touch controller; and a touch sensor panel comprising:

a plurality of touch electrodes in a first layer, including:

a plurality of first drive electrodes along a first axis, a plurality of second drive electrodes along the first axis, and a plurality of sense electrodes formed of sense electrode segments along a second axis, different from the first axis; and a plurality of bridges in a second layer, different from the first layer, the plurality of bridges including:

one or more portions along the second axis configured to electrically connect the sense electrode segments to form the plurality of sense electrodes, and one or more portions along the first axis disposed under the plurality of second drive electrodes.

9. The touch-sensitive device of claim 8, wherein:

the touch sensor panel includes a first touch node of the touch sensor panel;

the first touch node includes:

a first drive electrode of the plurality of first drive electrodes, a second drive electrode of the plurality of second drive electrodes, and a first sense electrode of the plurality of sense electrodes;

the first drive electrode is configured to be driven with a first stimulation signal forming a first mutual capacitance between the first drive electrode and the first sense electrode;

the second drive electrode is configured to be driven with a second stimulation signal having an opposite phase of the first stimulation signal and forming a second mutual capacitance between the second drive electrode and the first sense electrode; and a baseline mutual capacitance for the first touch node is at least the first mutual capacitance reduced by the second mutual capacitance.

10. The touch-sensitive device of claim 9, wherein:

the first touch node of the touch sensor panel includes a first bridge of the plurality of bridges;

the first bridge includes:

a first portion of the one or more portions along the second axis that is configured to touch two sense electrode segments of the sense electrode segments that form the plurality of sense electrodes, including the first sense electrode;

a first portion of the one or more portions along the first axis disposed under the second drive electrode;

a third mutual capacitance is formed between the second drive electrode and the first portion of the one or more portions along the first axis disposed under the second drive electrode; and the baseline mutual capacitance for the first touch node is at least the first mutual capacitance reduced by both the second mutual capacitance and the third mutual capacitance.

11. The touch-sensitive device of claim 10, wherein a width of the second drive electrode is different from a width of the first portion of the one or more portions along the first axis disposed under the second drive electrode.

12. The touch-sensitive device of claim 10, wherein a length of the first portion of the one or more portions along the first axis disposed under the second drive electrode is greater than a width of the first sense electrode along the first axis.

13. The touch-sensitive device of claim 10, wherein:

the first touch node also includes:

a third drive electrode of the plurality of first drive electrodes; and a fourth drive electrode of the plurality of second drive electrodes; and the first bridge of the first touch node also includes:

a second portion of the one or more portions along the second axis, different from the first portion of the one or more portions along the second axis, that is configured to touch the two sense electrode segments of the sense electrode segments that form the plurality of sense electrodes, including the first sense electrode;

a second portion of the one or more portions along the first axis, different from the first portion of the one or more portions along the first axis, disposed under the fourth drive electrode;

the first mutual capacitance of the first touch node is a sum of:

the mutual capacitance formed between the first drive electrode and the first sense electrode;

a mutual capacitance formed between the third drive electrode and the first sense electrode;

the second mutual capacitance of the first touch node is a sum of:

the mutual capacitance formed between the second drive electrode and the first sense electrode; and a mutual capacitance formed between the fourth drive electrode and the first sense electrode; and the third mutual capacitance of the first touch node is a sum of:

the mutual capacitance formed between the second drive electrode and the first portion of the one or more portions along the first axis disposed under the second drive electrode; and a mutual capacitance formed between the fourth drive electrode and the second portion of the one or more portions along the second axis disposed under the fourth drive electrode.

14. The touch-sensitive device of claim 13, wherein baseline mutual capacitance for the first touch node is the first mutual capacitance of the first touch node reduced by both the second mutual capacitance and the third mutual capacitance.

15. The touch-sensitive device of claim 14, comprising a touch screen that comprises a display that has an active area, wherein the touch sensor panel is formed over the active area of the display.

16. A touch screen comprising:

a display having an active area; and a touch sensor panel formed over the active area of the display, wherein the touch sensor panel comprises:

a plurality of touch electrodes in a first layer, including:

a plurality of first drive electrodes along a first axis, a plurality of second drive electrodes along the first axis, and a plurality of sense electrodes formed of sense electrode segments along a second axis, different from the first axis; and a plurality of bridges in a second layer, different from the first layer, the plurality of bridges including:

one or more portions along the second axis configured to electrically connect the sense electrode segments to form the plurality of sense electrodes, and one or more portions along the first axis disposed under the plurality of second drive electrodes.

17. The touch screen of claim 16, wherein:

a first touch node of the touch sensor panel includes:

a first drive electrode of the plurality of first drive electrodes, a second drive electrode of the plurality of second drive electrodes, and a first sense electrode of the plurality of sense electrodes;

the first drive electrode is configured to be driven with a first stimulation signal forming a first mutual capacitance between the first drive electrode and the first sense electrode;

the second drive electrode is configured to be driven with a second stimulation signal having an opposite phase of the first stimulation signal and forming a second mutual capacitance between the second drive electrode and the first sense electrode; and a baseline mutual capacitance for the first touch node is at least the first mutual capacitance reduced by the second mutual capacitance.

18. The touch screen of claim 17, wherein:

the first touch node of the touch sensor panel includes a first bridge of the plurality of bridges, the first bridge includes:

a first portion of the one or more portions along the second axis that is configured to touch two sense electrode segments of the sense electrode segments that form the plurality of sense electrodes, including the first sense electrode;

a first portion of the one or more portions along the first axis disposed under the second drive electrode;

a third mutual capacitance is formed between the second drive electrode and the first portion of the one or more portions along the first axis disposed under the second drive electrode; and the baseline mutual capacitance for the first touch node is at least the first mutual capacitance reduced by both the second mutual capacitance and the third mutual capacitance.

19. The touch screen of claim 18, wherein:

the first touch node also includes:

a third drive electrode of the plurality of first drive electrodes; and a fourth drive electrode of the plurality of second drive electrodes; and the first bridge of the first touch node also includes:

a second portion of the one or more portions along the second axis, different from the first portion of the one or more portions along the second axis, that is configured to touch the two sense electrode segments of the sense electrode segments that form the plurality of sense electrodes, including the first sense electrode;

a second portion of the one or more portions along the first axis, different from the first portion of the one or more portions along the first axis, disposed under the fourth drive electrode;

the first mutual capacitance of the first touch node is a sum of:

the mutual capacitance formed between the first drive electrode and the first sense electrode;

a mutual capacitance formed between the third drive electrode and the first sense electrode;

the second mutual capacitance of the first touch node is a sum of:

the mutual capacitance formed between the second drive electrode and the first sense electrode; and a mutual capacitance formed between the fourth drive electrode and the first sense electrode; and the third mutual capacitance of the first touch node is a sum of:

the mutual capacitance formed between the second drive electrode and the first portion of the one or more portions along the first axis disposed under the second drive electrode; and a mutual capacitance formed between the fourth drive electrode and the second portion of the one or more portions along the second axis disposed under the fourth drive electrode.

20. The touch screen of claim 19, wherein the baseline mutual capacitance for the first touch node is the first mutual capacitance of the first touch node reduced by both the second mutual capacitance and the third mutual capacitance.

\* \* \* \* \*